(12) United States Patent
Clevenger et al.

(10) Patent No.: US 7,692,308 B2
(45) Date of Patent: Apr. 6, 2010

(54) MICROELECTRONIC CIRCUIT STRUCTURE WITH LAYERED LOW DIELECTRIC CONSTANT REGIONS

(75) Inventors: Lawrence A. Clevenger, LaGrangeville, NY (US); Matthew E. Colburn, Hopewell Junction, NY (US); Louis C. Hsu, Fishkill, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/256,735

(22) Filed: Oct. 23, 2008

(65) Prior Publication Data

US 2009/0072410 A1 Mar. 19, 2009

Related U.S. Application Data

(62) Division of application No. 11/670,524, filed on Feb. 2, 2007, now Pat. No. 7,485,567.

(51) Int. Cl.
*H01L 29/40* (2006.01)

(52) U.S. Cl. ................. 257/774; 438/619; 257/E21.581

(58) Field of Classification Search .................. 257/774
See application file for complete search history.

(56) References Cited

U.S. PATENT DOCUMENTS

| | | | |
|---|---|---|---|
| 5,358,890 A | 10/1994 | Sivan et al. ................. 438/450 |
| 5,444,015 A | 8/1995 | Aitken et al. | |
| 6,013,536 A | 1/2000 | Nowak et al. | |
| 6,057,224 A | 5/2000 | Bothra et al. | |
| 6,228,763 B1 | 5/2001 | Lee et al. | |
| 6,329,279 B1 | 12/2001 | Lee et al. | |
| 7,078,814 B2 | 7/2006 | Stamper ..................... 257/760 |
| 2005/0037585 A1 | 2/2005 | Park et al. | |
| 2006/0038297 A1* | 2/2006 | Usami et al. ................. 257/758 |
| 2006/0267208 A1 | 11/2006 | Colburn et al. .............. 257/774 |
| 2007/0054485 A1* | 3/2007 | Torres et al. ................. 438/619 |

(Continued)

OTHER PUBLICATIONS

Gosset et al., "Integration of SiOC air gaps in copper interconnects," Microelectronic Engineering 70, pp. 274-279 (2003).

(Continued)

*Primary Examiner*—Thao X Le
*Assistant Examiner*—Kimberly Trice
(74) *Attorney, Agent, or Firm*—Daniel P. Morris, Esq.; Ryan, Mason & Lewis, LLP (57) ABSTRACT

The circuit structure includes at least two generally parallel conductor structures, and a plurality of substantially horizontal layers of layer dielectric material interspersed with substantially horizontally extending relatively low dielectric constant (low-k) volumes. The substantially horizontal layers and the substantially horizontally extending volumes are generally interposed between the at least two generally parallel conductor structures. Also included are a plurality of substantially vertically extending relatively low-k volumes sealed within the substantially horizontal layers and the substantially horizontally extending volumes between the at least two generally parallel conductor structures. The substantially vertically extending relatively low-k volumes and the substantially horizontally extending relatively low-k volumes reduce parasitic capacitance between the at least two generally parallel conductor structures as compared to an otherwise comparable microelectronic circuit not including the relatively low-k volumes.

3 Claims, 6 Drawing Sheets

U.S. PATENT DOCUMENTS

2007/0182013 A1* 8/2007 Zhu .......................... 257/751
2007/0232062 A1 10/2007 Nogami ...................... 438/638

OTHER PUBLICATIONS

Kawahara et al., "Highly thermal-stable, plasma-polymerized BCB polymer film," Plasma Sources Science and Technology 12, pp. S80-S88 (2003).

Loke et al., "Kinetics of Copper Drift in PECVD Dielectrics," IEEE Electron Device Letters, vol. 17, No. 12, pp. 549-551 (Dec. 1996).

Laura Peters, "Sony Demonstrates Feasibility of Copper/ULK (2.0) Interconnects," dated Jul. 1, 2006; http://www.reed-electronics.com/semiconductor/index.asp?layout=article; print &articleID=CA6347307.

U.S. Appl. No. 11/623,478, filed Jan. 16, 2007 titled "Circuit Structure with Low Dielectric Constant Regions and Method of Forming Same" of Clevenger et al.

* cited by examiner

MICROELECTRONIC CIRCUIT STRUCTURE WITH LAYERED LOW DIELECTRIC CONSTANT REGIONS

CROSS REFERENCE TO RELATED APPLICATIONS

This application is a divisional of U.S. patent application Ser. No. 11/670,524, filed Feb. 2, 2007 now U.S. Pat No. 7,485,567, the complete disclosure of which is expressly incorporated herein by reference in its entirety for all purposes.

FIELD OF THE INVENTION

The present invention generally relates to the electrical and electronic arts and, more particularly, to microelectronic circuit structures and their formation.

BACKGROUND OF THE INVENTION

To minimize microelectronic circuit delay caused by parasitic capacitance occurring in Back-End-Of-Line (BEOL) interconnects, conventional $SiO_2$ dielectric (dielectric constant k~4.0) has been replaced with lower-k films (k<3.0). For further performance improvement, aggressive reduction in parasitic capacitance is necessary. Currently, to accommodate microelectronic circuit speeds in the multiple GHz range, the dielectric constant is targeted at less than about 2.2.

Lowering parasitic capacitance can be achieved with new porous low-k dielectrics; however, most of the porous materials have relatively weak mechanical properties as compared to denser dielectrics. It is also a significant challenge to integrate these materials with other BEOL module processes. For example, the conventional chemical-mechanical polish (or CMP) process has difficulty in polishing porous dielectrics, and the conventional plasma vapor deposition (or PVD) of a diffusion barrier layer cannot offer reasonable coverage on the surface of porous dielectrics.

Accordingly, it would be desirable to overcome the limitations of prior art approaches.

SUMMARY OF THE INVENTION

Principles of the present invention provide techniques for forming microelectronic circuit structures with layered low dielectric constant regions. An exemplary embodiment of a method for manufacturing a microelectronic circuit, according to one aspect of the invention, includes the steps of providing a first wiring level comprising first wiring level conductors separated by a first wiring level dielectric material; forming a plurality of alternating layers of layer dielectric material and sacrificial material over the first wiring level; and forming a plurality of interconnect openings and a plurality of gap openings in the alternating layers of layer dielectric material and sacrificial material. The interconnect openings are formed over the first wiring level conductors. The method further includes forming (i) metallic conductors comprising second wiring level conductors, and (ii) interconnects, at the interconnect openings; and removing the layers of the sacrificial material through the gap openings.

In another aspect, an exemplary inventive electrical microelectronic circuit structure includes at least two generally parallel conductor structures, and a plurality of substantially horizontal layers of layer dielectric material interspersed with substantially horizontally extending relatively low dielectric constant (low-k) volumes. The substantially horizontal layers and the substantially horizontally extending volumes are generally interposed between the at least two generally parallel conductor structures. Also included are a plurality of substantially vertically extending relatively low-k volumes sealed within the substantially horizontal layers and the substantially horizontally extending volumes between the at least two generally parallel conductor structures. The substantially vertically extending relatively low-k volumes and the substantially horizontally extending relatively low-k volumes reduce parasitic capacitance between the at least two generally parallel conductor structures as compared to an otherwise comparable microelectronic circuit not including the relatively low-k volumes.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
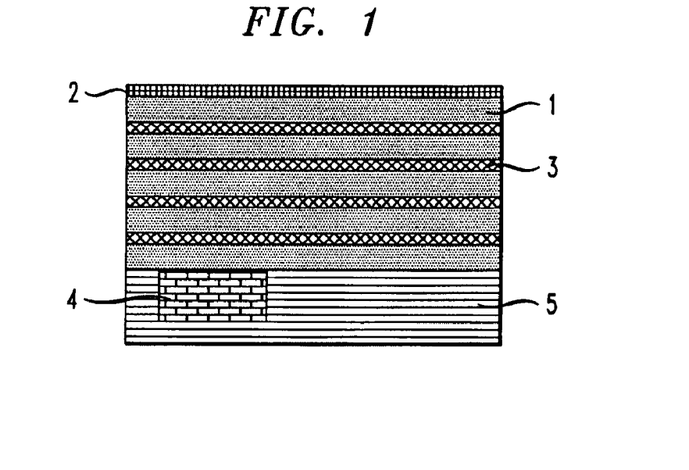
FIGS. 1-9 show steps in an exemplary method according to one aspect of the invention, FIG. 9 also showing a cross-section of an exemplary inventive microelectronic circuit structure taken along IX-IX in FIG. 10.

An exemplary method of manufacturing a microelectronic circuit will now be described with respect to the figures, in which like reference characters are used throughout to refer to like elements, unless otherwise noted. With reference to FIG. 1, which is a cross-sectional view (as are FIGS. 1-9), one step of the method includes providing a first wiring level comprising first wiring level conductors 4 (only one is shown for purposes of illustrative convenience) separated by a first wiring level dielectric material 5. Also included is the formation of a plurality of alternating layers of layer dielectric material 1 and sacrificial material 3 over the first wiring level. Optionally, an additional step of forming a capping layer 2 over the alternating layers of layer dielectric material 1 and sacrificial material 3 can also be performed.

Layer dielectric material 1 can be, for example, SiCOH; SiLK® (Registered trademark of DOW Chemical Co., Midland, Mich., USA) sealing and protective interlayer dielectric coating for use in computer disk drives, integrated circuits, and other computer hardware, software, or firmware; $SiO_2$; $Si_3N_4$; other conventional oxides and nitrides, and the like. Japan Synthetic Rubber (JSR) also makes suitable materials known, per se, to the skilled artisan. Capping layer material 2 can be, for example, SiC(N,H); $SiO_2$; $Si_3N_4$; CoWP, and the like. Sacrificial material 3 can be, for example, an epoxide such as cyclohexl-epoxide; an acrylate such as methacrylate (e.g., methyl methacrylate); cyclic and/or fused cyclic alkanes and/or alkenes such as norborene, adamantane, parylene, styrene, polyethylene oxide, and paracyclophane; or other polymeric or nonpolymeric films. Metal line 4 can be, for example, Cu, Al, Cu(Al), W, and the like. Material 5 can be, for example, SiCOH; SiLK® dielectric coating; JSR; $SiO_2$; $Si_3N_4$; and the like.

By way of review and provision of further exemplary detail, after the lower wiring level comprising conductor 4 and insulating material 5 are made, multi-layer inter-layer dielectric (ILD) film comprising alternating layers of sacrificial material 3 and dielectric material 1 and a capping layer 2 are deposited. The film thickness ratio of the multi-layer film is not necessarily equal. Further, the layers need not be heterogeneous; different layer dielectrics and different sacrificial materials of can be used for different layers, so long as the sacrificial material is selectively removable with respect to the layer dielectric. Indeed, different materials may be employed, if desired, for all the dielectric layers, regions, and structures described herein.

Figure 2:
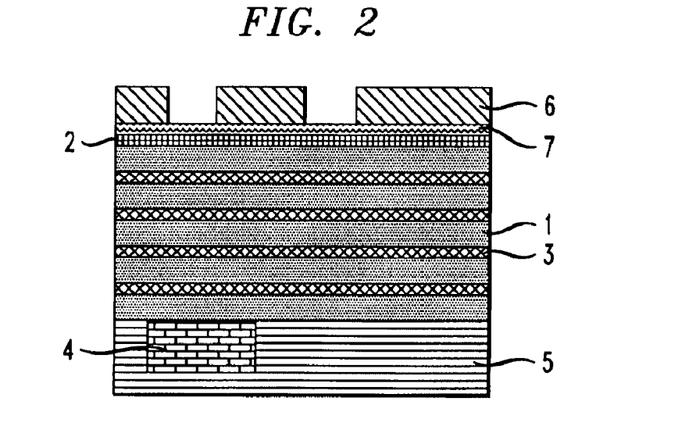
Figure 3:
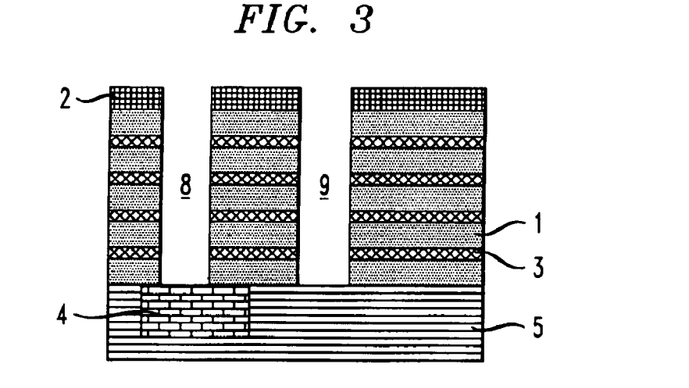

With reference to FIGS. 2 and 3, an additional step can include forming a plurality of interconnect openings 8 and a plurality of gap openings 9 in the alternating layers of layer dielectric material 1 and sacrificial material 3. The interconnect openings 8 can be formed over the first wiring level conductors 4. The openings 8 and 9 can be formed, for example, by employing trench lithography to form a layer 6, substantially resistant to etching, over the alternating layers of layer dielectric material 1 and sacrificial material 3. The etching-resistant layer 6 has gaps where the interconnect openings and the gap openings are to be formed. The interconnect openings 8 and the gap openings 9 are etched as seen in FIG. 3. It should be noted that an antireflective layer 7 can be provided under layer 6. Layer 6 can be formed from positive or negative photoresists. Layer 7 can be formed from organic or inorganic materials.

The interconnect openings 8 can have a polygonal cross-section when viewed end-on (that is, from above layer 2 in FIG. 3). A polygonal cross-section includes a circular cross-section, as a circle is a polygon with an infinite number of infinitesimally short sides. Thus, in one or more embodiments, the interconnect openings comprise via interconnect openings having a generally circular cross-section. As is known to the skilled artisan, "vias" are inter-level conductive connections that typically have a circular cross section. The gap openings 9 can also have a polygonal cross-section.

Interconnect openings 8 will eventually include interconnects allowing connection between an upper wiring level and the conductors 4 of the lower wiring level shown in FIGS. 1-3. Gap openings 9 will be used for forming a contact channel to remove sacrificial material 3 in the multiplayer ILD film. Thus, in general terms, an additional step includes forming: (i) metallic conductors comprising second wiring level conductors, and (ii) interconnects at the interconnect openings 8; one manner of doing this will be seen with regard to FIGS. 4-7.

Figure 4:
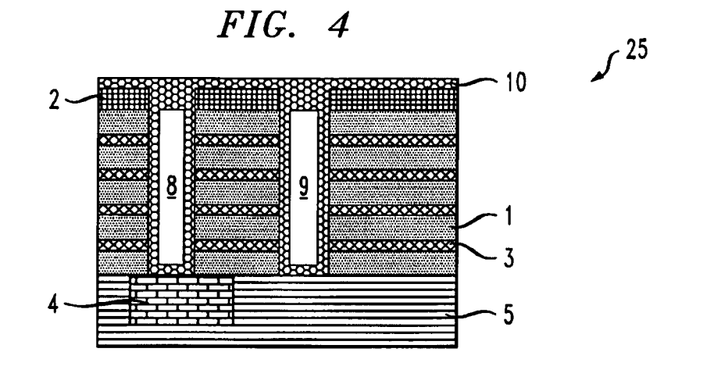
Figure 5:
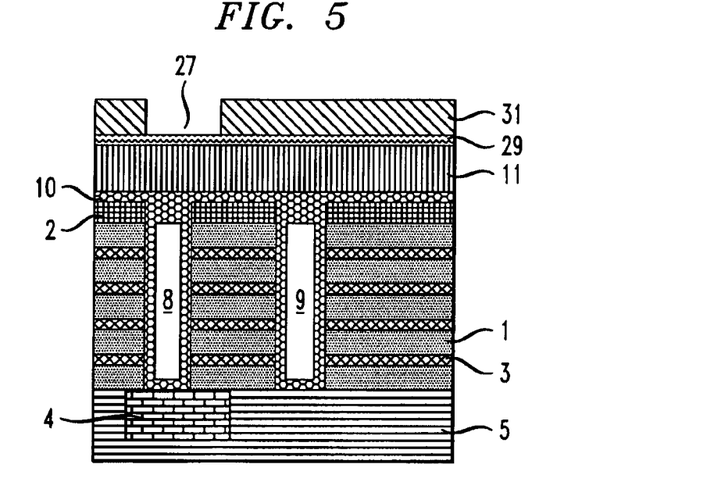

With reference now to FIG. 4, the interconnect openings and the gap openings can be filled via inorganic chemical vapor deposition (CVD) of material 10 to form a filled structure 25. Material 10 can be, for example, an ultra-low-dielectric-constant material (ULK) (K ranging from about 2.0 to about 2.7), SiCOH, or the like. This deposition tends to close up the top portion of the gaps. Turning now to FIG. 5, trench lithography can be employed to form a layer substantially resistant to etching over the filled structure 25. The etching-resistant layer has gaps 27 over the interconnect openings 8. The layer can be, for example, a multi-layer organic material, including, for example, an under-layer material such as polyimide 11, anti-reflective coating layer 29 and a photo-resist layer 31, wherein the resist is lithographically patterned.

Figure 6:
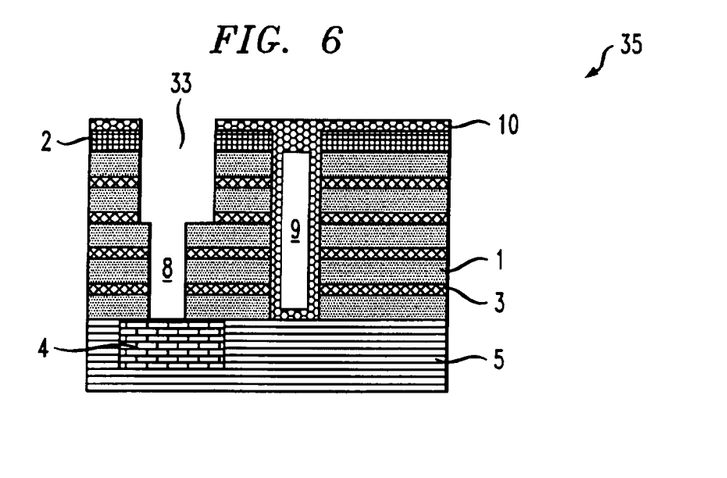

As seen in FIG. 6, an additional step can include etching trenches 33 at the interconnect openings to form an etched structure 35. The etching process is preferably carried out via dry etch and directional etch, to etch open the line and interconnect (via) for a subsequent dual Damascene process, while leaving the air gap (or other low-k volume) untouched. The etching process is per se known to the skilled artisan. While sometimes referred to herein as "air gaps" or the like, a number of strategies can be employed to obtain the horizontal and vertical low-k volumes, as discussed herein. For example, in one or more embodiments, the relatively low-k volumes contain substantially gaseous material trapped during the fabrication process, including but not limited to air. In one or more embodiments, pertinent fabrication steps can be performed in a vacuum; a pressure of, for example, 1 torr, 10 mtorr, or even an ultra high vacuum of 10-9 torr might be possible (although the latter might be challenging to obtain). The skilled artisan will appreciate that even an ultra high vacuum contains some gaseous material.

Figure 7:
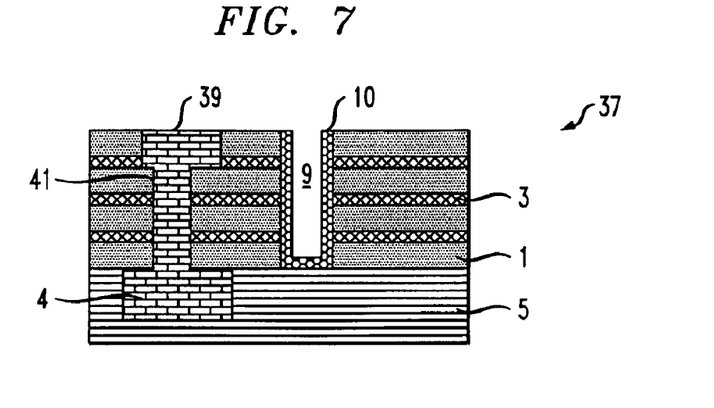

In FIG. 7, the etched structure 35 can be metallized to produce a metallized etched structure comprising the second wiring level conductors 39 and the interconnects 41 (in the exemplary embodiment depicted, after the conventional dual-Damascene process is carried out, the etched patterns are filled with barrier liner and metal, and a conventional chemical-mechanical polishing (CMP) process is conducted to planarize the surface of the metallized etched structure, remove excessive conductive material at the surface (reducing thickness of the second wiring level conductors 39), and open up the air gap (or other low-k volume) 9). The result is planarized structure 37. The first wiring level conductors 4, the second wiring level conductors 39, and the interconnects 41 form a series of conductor structures having the "I-beam-like" cross section shown in FIGS. 7-9.

Figure 8:
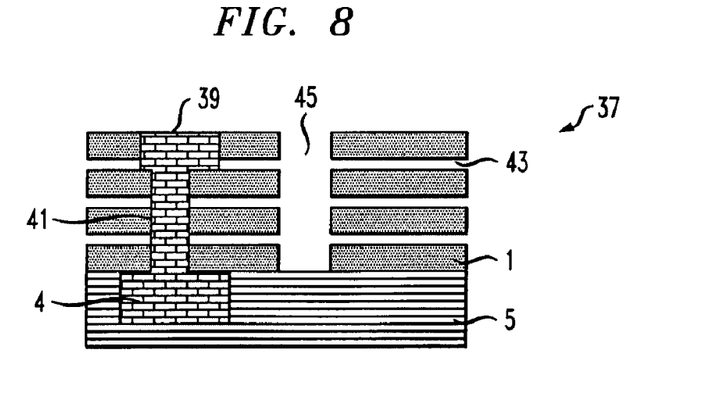

In FIG. 8, the layers of the sacrificial material 3 are removed through the gap openings 9. This can be accomplished in a number of different manners. For example, a wet process can be performed to first remove inorganic CVD material 10 employed for air gap sealing, and then the sacrificial material 3 from the multi-layer deposition, to form horizontal multi air chambers 43. In general terms, the layers of the sacrificial material are replaced with substantially horizontally extending relatively low dielectric constant (low-k) volumes 43, and substantially vertically extending relatively low-k volumes 45 are formed in the gap openings. In one or more embodiments, the substantially vertically extending relatively low-k volumes 45 and the substantially horizontally extending relatively low-k volumes 43 contain substantially air, which simply flows into the regions when the layers are removed, but of course, low-k materials other than air could be used (and as noted, in some embodiments, a vacuum will exist in the volumes). The relatively low-k volumes can have, for example, a dielectric constant of from about 1 to about 1.1.

As noted, many techniques can be employed to remove the sacrificial material 3. For example, the material can be exposed to ultraviolet light, of a wavelength that will be appreciated by the skilled artisan, given the teachings herein, to degrade carbon-carbon sigma bonds in the sacrificial material. Where the sacrificial material comprises a water soluble material (Germanium Oxide, e.g.), the removing of the layers of the sacrificial material 3 can comprise exposing the sacrificial material 3 to water. In other aspects, the removing of the layers of the sacrificial material 3 can comprise exposing the material 3 to thermal energy, or chemical extraction, or a photolytic process.

Figure 9:
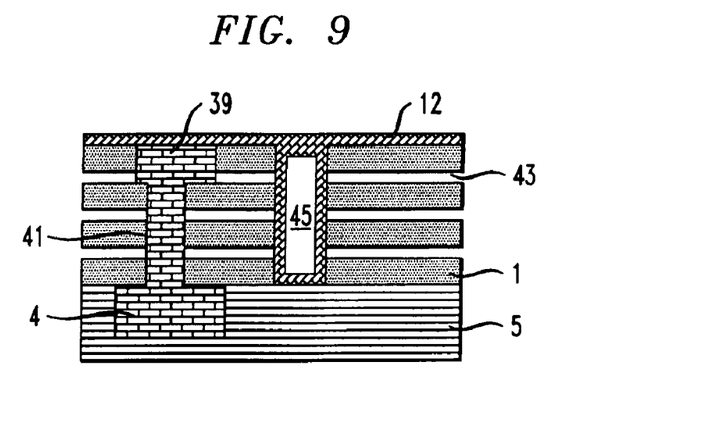

Preferably, the substantially vertically extending relatively low-k volumes 45 and the substantially horizontally extending relatively low-k volumes 43 can be sealed. In one or more embodiments, this can be done by adding a sealing medium, which can, if desired, be pre-selected to enhance structural properties of the microelectronic circuit. Turning now to FIG. 9, inorganic CVD of a material 12 can be performed over the planarized structure 37 to seal the relatively low-k material in the openings 43, 45 (including, in one or more embodiments, maintaining a volume therein by keeping ambient materials out); in the specific example illustrated, the CVD process is similar to that described with respect to FIG. 4, and uses similar materials. It can be carried out to seal the air gap and strengthen the structure.

Figure 10:
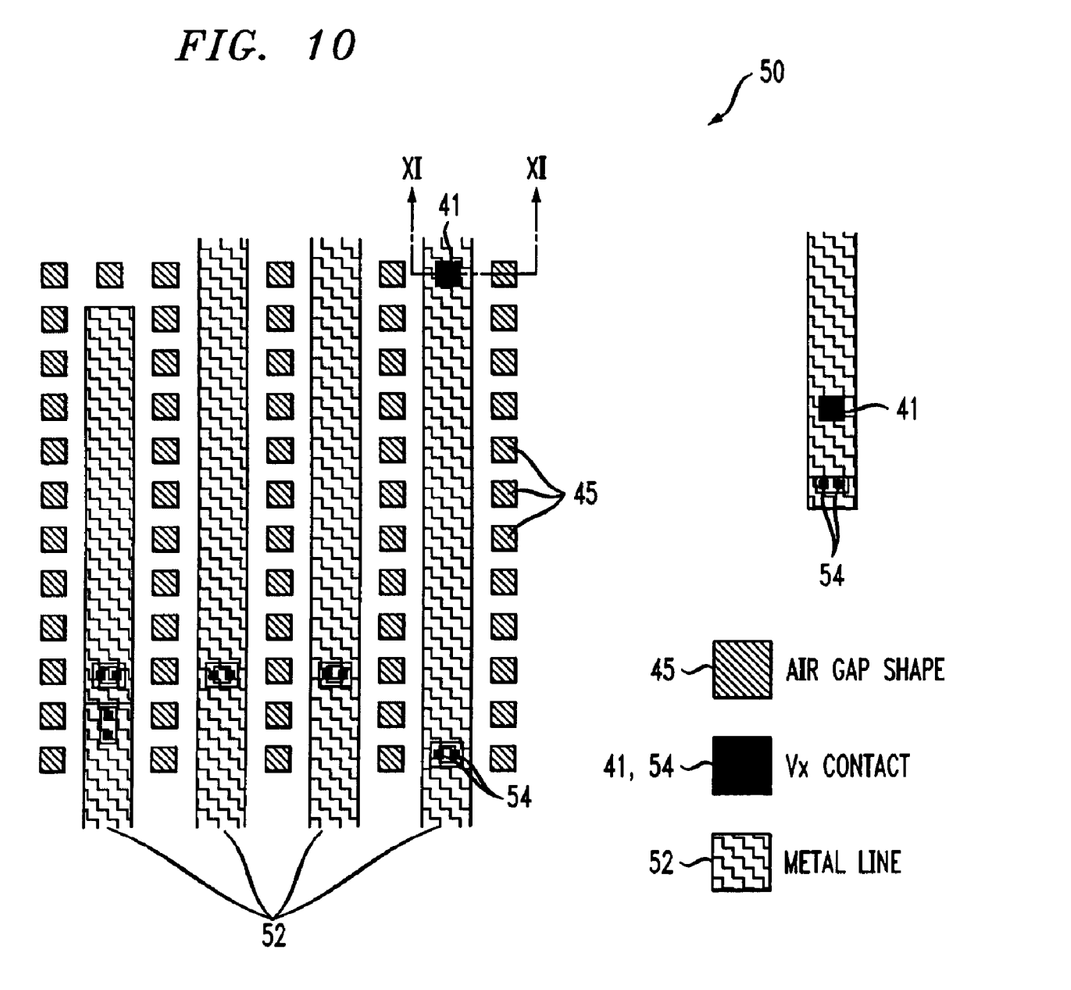
FIG. 10 shows a top view of the exemplary inventive microelectronic circuit structure.

Still giving attention to FIG. 9, and turning also now to FIG. 10, an exemplary structure will now be discussed. Note that FIG. 10 is a top plan view of an exemplary microelectronic circuit structure 50 with FIG. 9 being a cross section taken along line IX-IX thereof. The first wiring level conductors 4, the second wiring level conductors 39, and the interconnects 41 form a series of conductor structures 52. The substantially vertically extending relatively low-k volumes 45 and the substantially horizontally extending relatively low-k volumes 43 reduce parasitic capacitance between adjacent ones of the conductor structures 52 as compared to an otherwise comparable microelectronic circuit not including the substantially vertically extending relatively low-k volumes 45 and the substantially horizontally extending relatively low-k volumes 43. An "otherwise comparable" microelectronic circuit contemplates the case of a circuit having all similar materials and dimensions, except for the low-k volumes. Of course, parasitic capacitance is only reduced where the low-k volumes have a lower k than the dielectric material 1, but this is the case with current microelectronic circuit fabrication technologies.

Elements 4 and 39 are preferably continuous in and out of the page in FIG. 9, but need not be, depending on the application. Interconnects 41 are preferably not continuous in and out of the page, but are localized structures providing structural support for elements 39 and electrical and thermal conduction between elements 4 and 39.

In general terms, an electrical circuit structure 50 comprises at least two generally parallel conductor structures 52, a plurality of substantially horizontal layers of layer dielectric material 1 interspersed with substantially horizontally extending relatively low dielectric constant (low-k) volumes 43, and a plurality of substantially vertically extending relatively low-k volumes 45 sealed within the substantially horizontal layers 1 and the substantially horizontally extending volumes 43 between the at least two generally parallel conductor structures 52. The substantially horizontal layers 1 and the substantially horizontally extending volumes 43 are generally interposed between the at least two generally parallel conductor structures 52.

As noted above with respect to the method description, the substantially vertically extending relatively low-k volumes 45 and the substantially horizontally extending relatively low-k volumes 43 can contain substantially gaseous material, and the at least two generally parallel conductor structures 52 can comprise metallized dual-Damascened via line structures. In general, one or more embodiments of inventive microelectronic circuit structures can employ one or more features discussed with regard to the method description.

As seen in FIG. 10, columns of air gaps 45 are formed in between metal wires 52, and a few interconnects (vias) 41, 54 are shown inside the wires 52. In general, one can have two contacts aligned horizontally and vertically; the cross-sectional view is directed to the pair aligned vertically. The three-dimensional air chambers 43, 45 are supported by the adjacent wiring 52. Such structure is extremely useful, especially (by way of example and not limitation), in areas where a plurality of critical signal paths are routed. One or more embodiments may help to reduce cross-talk and/or improve signal bandwidth. For example, in a current 11.1 Gb/s SerDes (Serializer/Deserializer) high-speed data link design not employing inventive techniques, the wiring capacitance in the front-end restricts the signal bandwidth. Purely by way of example and not limitation, use of inventive techniques may reduce the wiring capacitance by 40% or more, and the resulting signal bandwidth may be extended to 16 Gb/s and beyond.

Figure 11:
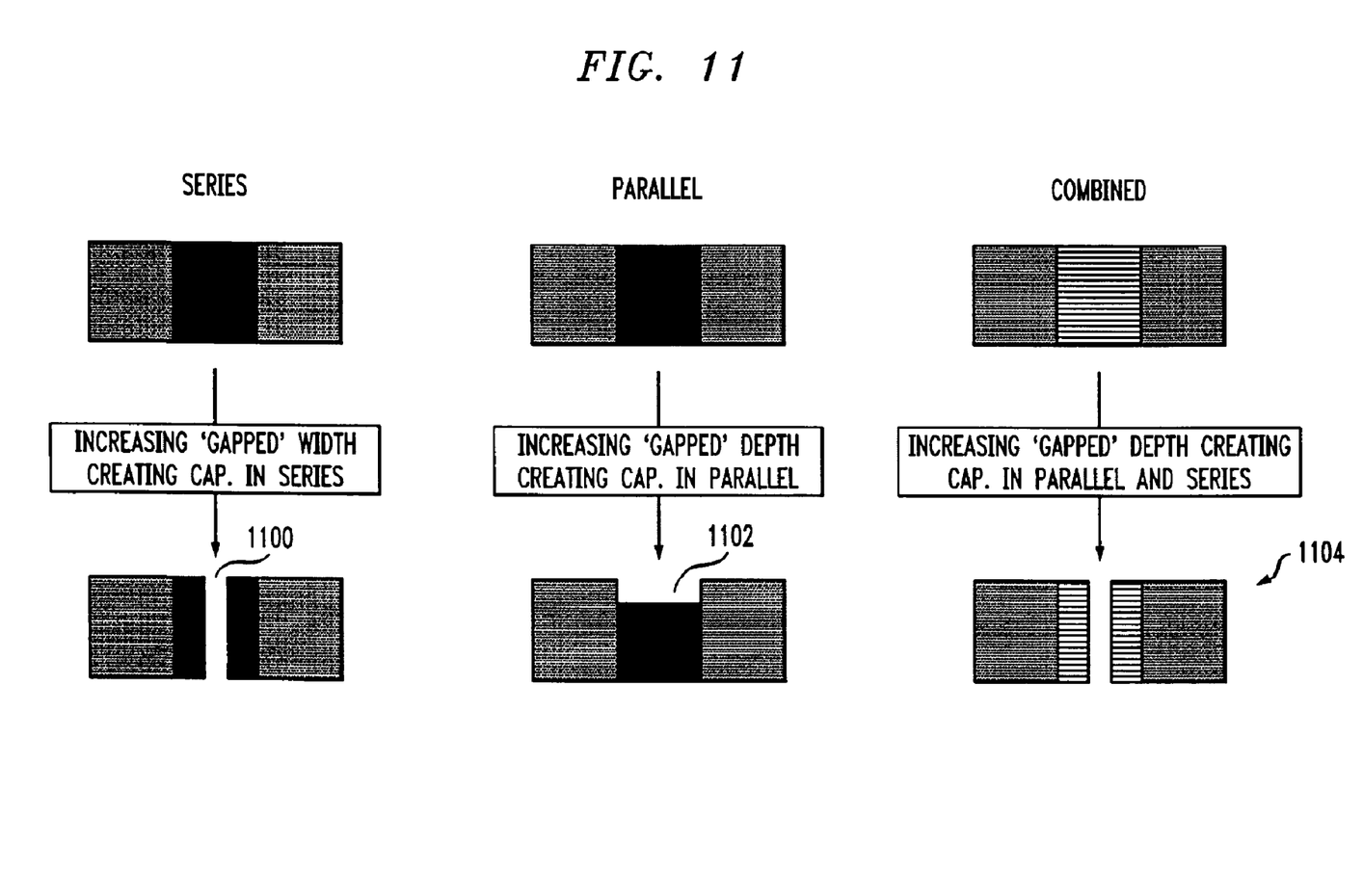
FIG. 11 shows three cases illustrating exemplary parasitic capacitance reduction.
Figure 12:
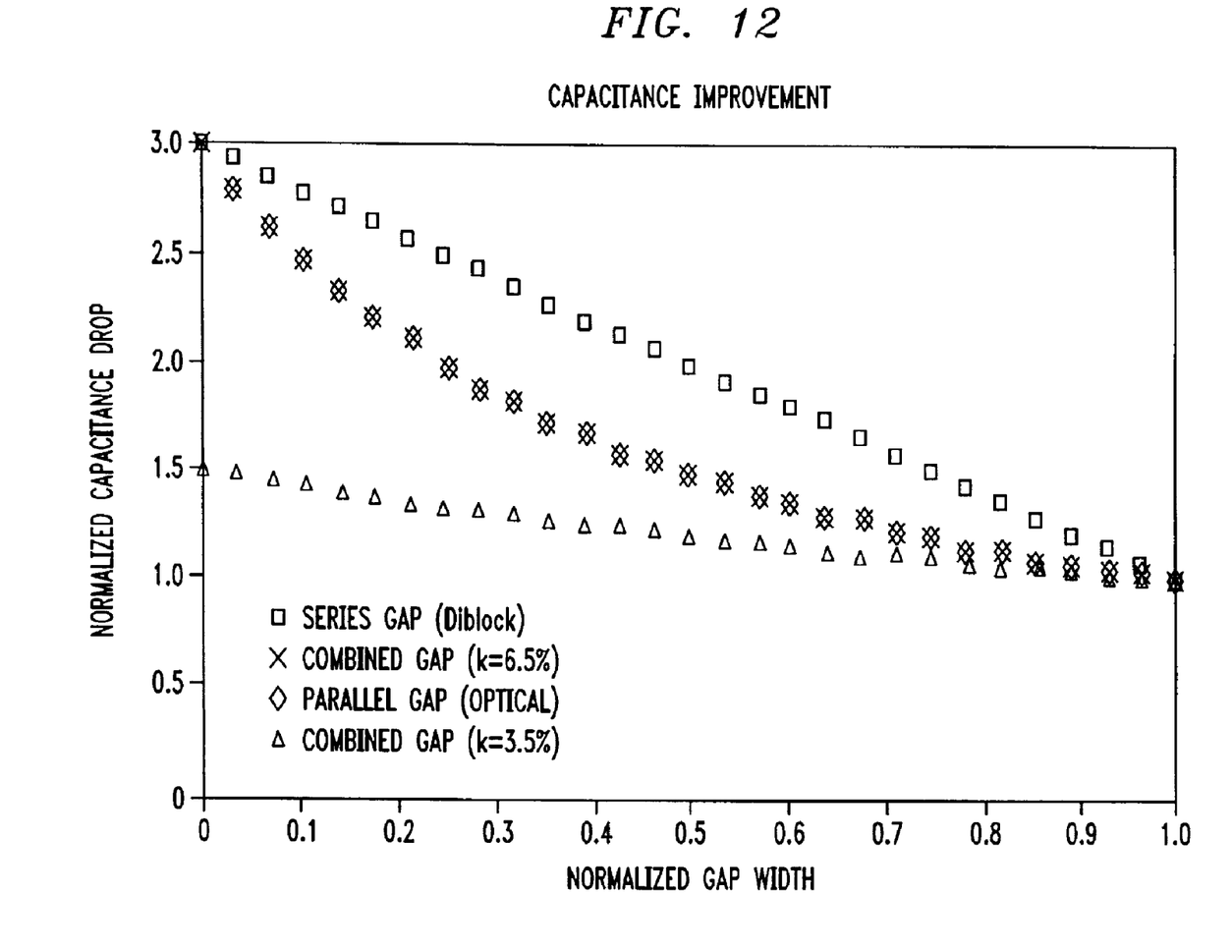
FIG. 12 plots illustrative results for the cases of FIG. 11.

Giving attention to FIG. 11, three different air chambers are presented. The first type is a vertically-shaped air chamber 1100. The second type is a horizontally-shaped air chamber 1102. The third column depicts an exemplary embodiment 1104 of the invention. The analysis is based on 50% of the air volume in the cavity (or gap) and estimation of the net capacitance of three different types of air chamber. An over-all 40% capacitance reduction can result from the inventive techniques as compared to those from the prior art, as seen in FIG. 12. It is to be emphasized that the example is purely for purposes of illustration, and in any given application, gains of greater or less than 40% may be achieved with one or more inventive embodiments.

Inventive air-chambers can be placed strategically areas where they are necessary. For those areas where signal paths are not dense and signal speed is not critical, fewer chambers can be installed. On the contrary, for those areas where critical signal paths are dense, more chambers can be installed. Intelligent chamber placement is considered during the design and can be included in the microelectronic circuit simulation. Advantages of one or more embodiments of the invention can include one or more of: (1) Low Cost—not only is no additional mask needed, but also one or more inventive embodiments are compatible with the current BEOL process flow, (2) Better Technology Extendibility—no limitation on dialectic materials (one or more embodiments of the invention are compatible with the existing BEOL process flow, and thus, new process development is not required0, and (3) substantial decrease in capacitance (up to 40% in the example given).

One or more embodiments of the invention provide capacitance improvement for BEOL interconnects by introducing multilayer dielectric film comprising alternating layers of sacrificial material and low-k dielectric material. The sacrificial material is eventually removed to lower parasitic capacitance. A multilayer film comprising alternating films of sacrificial material and dielectric material can be created. A plurality of air contact channels can be formed in the multilayer film during the interconnect (via) formation process. The sacrificial material in the multilayer film can be removed through air contact channels so that the overall parasitic capacitance can be significantly reduced. The air contact channels can be sealed. The proper amount of air chambers can be intelligently placed at the proper locations on the chip during design to achieve maximum microelectronic circuit performance improvement and minimum structural risk.

The techniques set forth herein can be used to make circuits realized on an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete microelectronic circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An electrical microelectronic circuit structure, comprising:

at least two generally parallel conductor structures;

a plurality of substantially horizontal layers of layer dielectric material interspersed with substantially horizontally extending relatively low dielectric constant (low-k) volumes, said substantially horizontal layers and said substantially horizontal extending volumes being generally interposed between said at least two generally parallel conductor structures; and a plurality of substantially vertically extending relatively low-k volumes surrounded by an ultra-low-dielectric-constant sealing material and sealed within said substantially horizontal layers and said substantially horizontally extending volumes between said at least two generally parallel conductor structures, said plurality of substantially vertically extending relatively low-k volumes being perpendicular to said substantially horizontally extending relatively low-k volumes when viewed in cross section, said plurality of substantially vertically extending relatively low-k volumes being parallel to said at least two generally parallel conductor structures when viewed in said cross section, said plurality of substantially vertically extending relatively low-k volumes being sealed from said substantially horizontally extending relatively low-k volumes by said sealing material;

wherein said electrical microelectronic circuit structure exhibits reduced parasitic capacitance between said at least two generally parallel conductor structures as compared to an otherwise comparable microelectronic circuit not including said relatively low-k volumes, said relatively low-k volumes having a dielectric constant of from about 1 to about 1.1.

2. The structure of claim 1, wherein said substantially vertically extending relatively low-k volumes and said substantially horizontally extending relatively low-k volumes contain substantially gaseous material.

3. The structure of claim 2, wherein said at least two generally parallel conductor structures comprise metallized dual-Damascened via line structures.

* * * * *